(12) United States Patent
Gruening et al.

(10) Patent No.: US 6,812,091 B1
(45) Date of Patent: Nov. 2, 2004

(54) TRENCH CAPACITOR MEMORY CELL

(75) Inventors: Ulrike Gruening, Munich (DE); Johann Alsmeier, Radebeul (DE)

(73) Assignee: Infineon Technologies AG, Munich (DE)

(*) Notice: Subject to any disclaimer, the term of this patent is extended or adjusted under 35 U.S.C. 154(b) by 116 days.

(21) Appl. No.: 09/669,585

(22) Filed: Sep. 26, 2000

(51) Int. Cl.⁷ .................. H01L 21/8242; H01L 21/20
(52) U.S. Cl. .................. 438/243; 438/242; 438/386
(58) Field of Search .................. 438/240–254, 438/386; 257/296–310

(56) References Cited

U.S. PATENT DOCUMENTS

| | | | |
|---|---|---|---|
| 5,168,336 A | 12/1992 | Mikoshiba | .................. 257/303 |
| 6,037,194 A * | 3/2000 | Bronner et al. | .............. 438/147 |

FOREIGN PATENT DOCUMENTS

| | | |
|---|---|---|
| EP | 1030362 A | 8/2000 |
| JP | 60257655 | 11/1985 |
| JP | 62-118567 | 5/1987 |
| JP | 01008367 | 1/1989 |
| JP | 01010310 | 1/1989 |
| JP | 02-188957 | 7/1990 |
| JP | 02-189968 | 7/1990 |

* cited by examiner

*Primary Examiner*—Cuong Nguyen
(74) *Attorney, Agent, or Firm*—Slater & Matsil, L.L.P.

(57) ABSTRACT

An improved sub $8F^2$ memory cell is disclosed. The sub $8F^2$ cell includes a shallow transistor trench in which a buried portion of the transistor occupies.

13 Claims, 17 Drawing Sheets

TRENCH CAPACITOR MEMORY CELL

FIELD OF THE INVENTION

The invention generally relates to integrated circuits (ICs) and, in particular, to a sub-8F$^2$ memory cell.

BACKGROUND OF THE INVENTION

FIG. 1 shows a 8F$^2$ trench capacitor DRAM cell. Such a DRAM cell is described in, for example, Nesbit et al., A 0.6 μm$^2$256 Mb *Trench DRAM Cell With Self-Aligned Buried Strap (BEST)*, IEDM 93-627, which is herein incorporated by reference for all purposes. As shown, the DRAM cell includes a trench capacitor 160 formed in a substrate 101. The trench is filled with, for example, n-type doped-polysilicon (poly) 161. The doped-poly serves as the storage electrode (also referred as a storage nodeo) of the capacitor. An n-doped buried plate 165 surrounds the lower portion of the trench. The buried plate serves as the second electrode of the capacitor. A dielectric collar 168 lines inner sidewalls in the upper portion of the trench to reduce vertical parasitic leakage around the deep trench. Typically, the collar is about 1 nm deep. A node dielectric 163 is provided in the lower portion of the trench separating the two plates of the capacitor. A buried well 170 comprising n-type dopants connects the buried plates of the DRAM cells in the array. A p-well can be located above the buried well to reduce vertical leakage.

A transistor 110 is coupled to the capacitor 150. The transistor includes a gate 112 and diffusion regions 113 and 114 comprising n-type dopants. The gate of the transistor forms a gate conductor, serving as a wordline. The diffusion regions are referred to as the "source" and "drain." The designation of source and drain depends on the operation of the transistor. Coupling of the transistor to the capacitor is achieved via a diffusion region 125, which is formed by outdiffusing dopants from the storage node through a buried strap 127.

To provide sub-8F$^2$ cells, sub-ground rule features are used to form, for example, the transistor of the cell. The use of sub-ground rule features results in decreasing the distance between the buried strap, creating process control issues.

For example, the outdiffusion of dopants from the buried strap to form diffusion region 125 can easily diffuse into the channel region of the transistor, which can result in shorts. The use of sub-ground rule features to form the gates also decreases channel length, which requires larger implant doses to control the gate threshold voltage ($V_T$). This leads to increased junction leakage, thus decreasing performance and device reliability.

As evident from the above discussion, it is desirable to provide an improved sub-8F$^2$ cell memory cell.

SUMMARY OF THE INVENTION

The invention relates to an improved sub-8F$^2$ memory cell. The memory cell includes a trench capacitor coupled to a transistor via a buried strap. In one embodiment, the buried strap is formed after the formation of a shallow trench isolation. The strap is formed without requiring a mask. Forming the buried strap after the shallow trench isolation is formed advantageously reduces out diffusion of dopants.

In another embodiment, a shallow transistor trench is formed in the substrate in which a buried portion of the transistor occupies. The shallow transistor trench enables an increase in channel length of the transistor without increasing the surface area needed to form the transistor. In one embodiment, self-aligned capping layer is provided on top of the deep trench capacitor to serve as a mask to form the shallow transistor trench. The capping layer prevents the shallow transistor trench from cutting the buried strap connection, thereby increasing process tolerances.

DETAILED DESCRIPTION OF THE INVENTION

The present invention relates to an improved memory cell used in integrated circuits (ICs). The ICs include, for example, various types memory circuits such as dynamic random access memories (DRAMs), synchronous DRAMs (SDRAMs), static RAMs (SRAMs), or read only memories (ROMs). Also, the ICs may include logic devices such as a programmable logic arrays (PLAs), application specific ICs (AS ICs), merged DRAM-logic lCs (embedded DRA Ms), or any other circuit devices.

Typically, numerous lCs are fabricated on a substrate in parallel, such as a silicon wafer. After processing, the wafer is diced to separate the ICs into a plurality of individual chips. The chips are then packaged into final products for use in, for example, consumer products such as computer systems, cellular phones, personal digital assistants (PDAs), and other electronic products.

Figure 1:
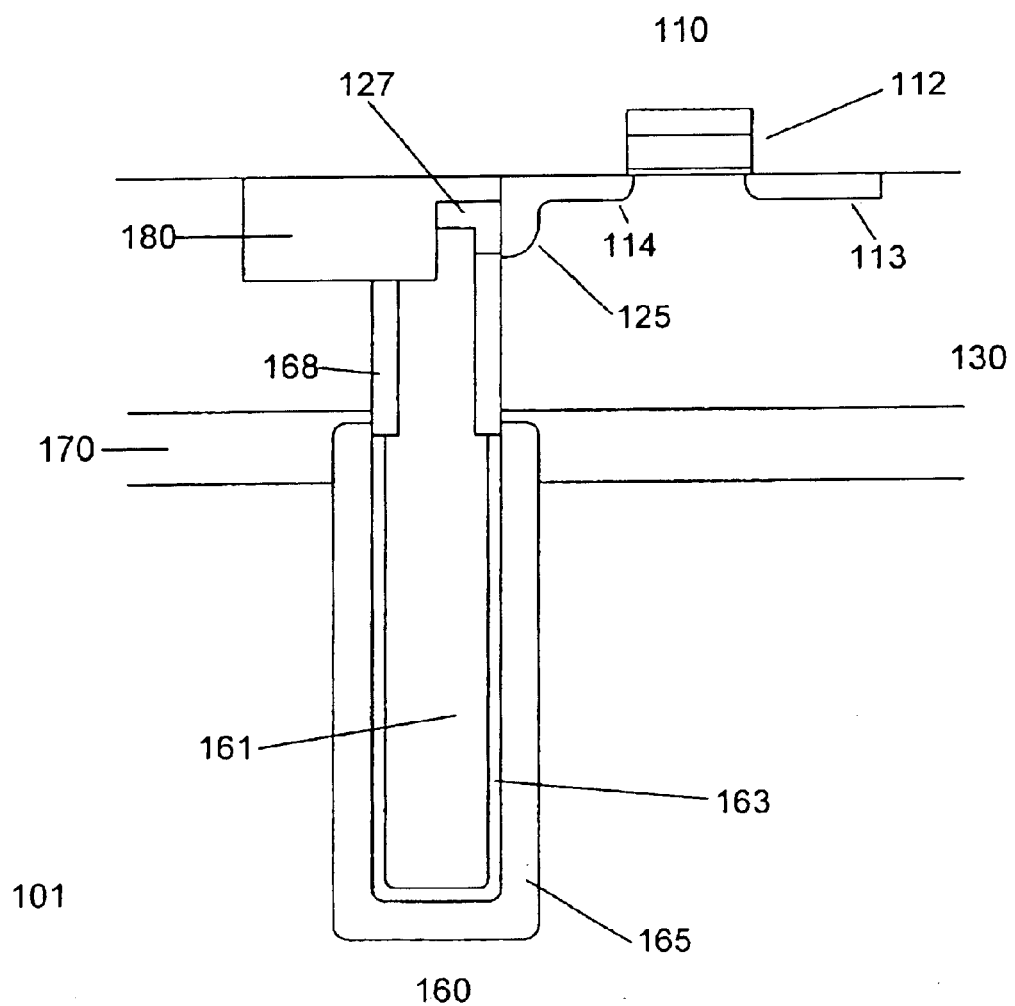
FIG. 1 shows a conventional DRAM cell.
Figure 2:
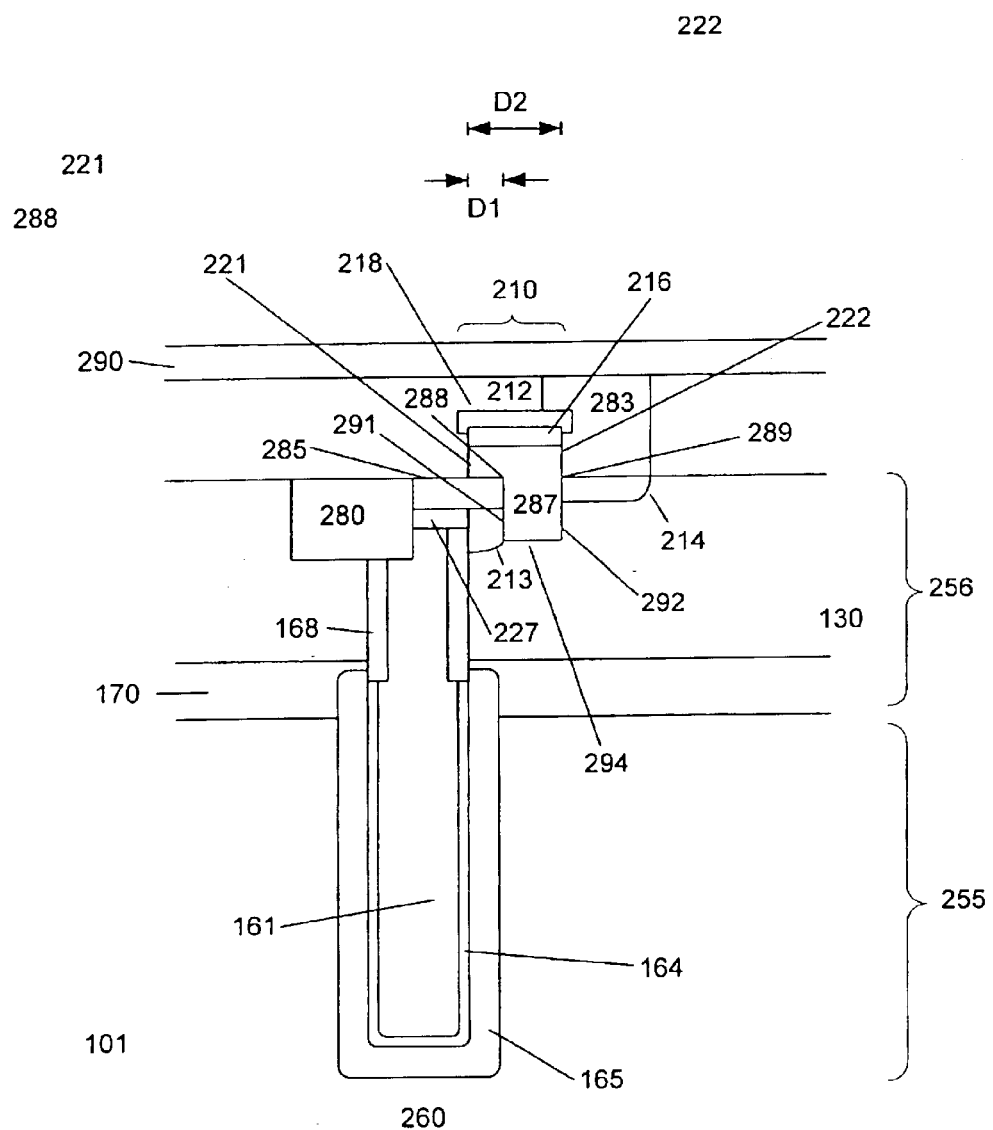
FIG. 2 shows a memory cell in accordance with one embodiment of the invention.

FIG. 2, shows a memory cell in accordance with one embodiment of the invention. The memory call includes a trench capacitor 260 formed in a substrate 101. The substrate, for example, comprises a semiconductor substrate such as a silicon wafer. Other types of semiconductor substrates, such as silicon-on-insulator (SOI), are also useful. The trench, in one embodiment, is filled with n-doped poly 161 to serve as the storage node. The use of p-doped poly is also useful.

A buried plate 185 surrounds a lower portion 255 of the trench. The buried plate comprises the same type of dopants (e.g. n or p-type) as the storage node. In one embodiment, the buried plate comprises n-type dopants. The buried plate can be formed by diffusing dopants into the substrate from a dopant source to form a buried diffusion region surrounding the lower portion of the trench. Alternatively, a doped epitaxial (epi) silicon layer can be provided to line the lower portion of the trench sidewalls. A dielectric layer 164 is provided in the lower portion of the trench to separate the storage node and buried plate.

In an upper portion 256 of the trench, a dielectric collar 168 is provided to line the trench sidewalls. A shallow trench 280 is formed in the substrate and filled with, for example, oxide to form a shallow trench isolation (STI). The STI overlaps a portion of the trench and has a depth sufficient, for example, to insulate neighboring cells. The portion of the STI that overlaps the trench contacts the upper surface of the collar.

In accordance with the invention, a shallow transistor trench (STT) 287 is provided in the substrate adjacent to the capacitor. As shown, the STT comprises a rectangular shape with first and second sidewalls 291 and 292 and a bottom surface 294. The first and second sidewalls extend into the substrate from first and second edges 288 and 289. Providing an STT having other geometric shapes, such as a triangle or semicircle, is also useful. The distances of the first and second edges of the STr from the capacitor are equal to D1 and D2, respectively. In accordance with one embodiment of the invention, D1 is less than the feature size (F) and D2 is equal to about F, creating an STT having a width which is less than F (i.e., a sub-groundrule feature). The depth of the trench is below the depth of the buried strap. A transistor 210 comprising a gate 212 and first and second diffusion regions 213 and 214 is provided. In accordance with the invention, the gate includes a buried and a non-buried portion. The buried portion occupies the STT and the non-buried portion is located above the STT. The non-buried or upper portion, for example, comprises a dimension equal to about F, with first and second gate edges 221 and 222 being aligned with the capacitor and the second trench edge. Providing an upper transistor gate portion having other dimensions is also useful. The gate comprises, for example, doped poly. Alternatively, a gate stack which includes a salicide layer 216 over the doped poly is provided. Other types of gate materials are also useful. A dielectric cap comprising, for example, nitride is formed over the gate. The nitride cap serves as an etch stop for forming a bitline contact 283 that couples the diffusion region 213 to a bitline 290.

The first diffusion region is located in a substrate region between the capacitor and the first STT edge, coupling the capacitor to the transistor. The first diffusion region is isolated from the upper portion of the gate by a dielectric layer 285. The dielectric layer serves as a self-aligned mask to form the STT. The second diffusion region is located in a substrate region adjacent to the second STT edge. A dielectric layer (not shown) lines the STT to serve as the gate dielectric. The STT wall or walls between the first and second diffusion region forms a channel of the transistor. The STT provides a longer channel length without a corresponding increase in substrate surface area and blocks the buried strap out diffusion from impacting the transfer device.

Figure 3:
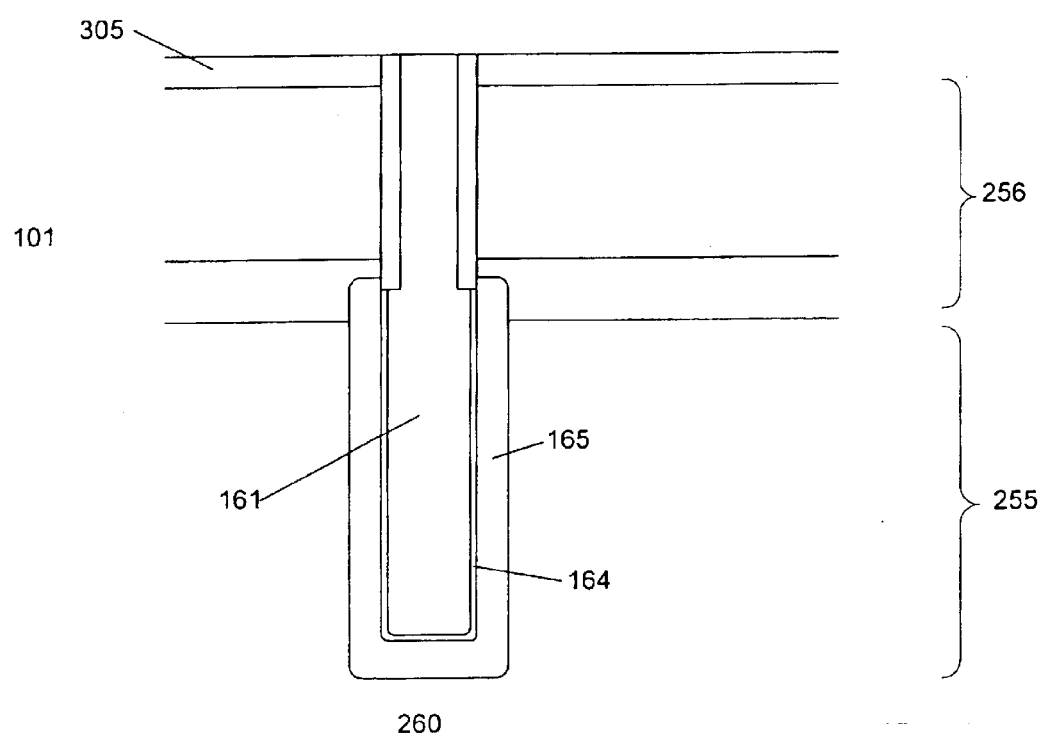
FIGS. 3-14 show a process of forming a memory cell in accordance with one embodiment of the invention.

Referring to FIG. 3, a cross section of an IC 101 is shown. The IC includes a substrate comprising, for example, silicon. Other semiconductor substrates, such as SOI, are also useful. The substrate includes a partially formed trench capacitor 260. The partially formed trench capacitor can be fabricated by conventional techniques, such as those described in, for example, Nesbit et al., A 0.6 $\mu m_2 256$ Mb *Trench DRAM Cell With Self-Aligned Buried Strap (BEST)*, IEDM 93–627, which is already herein incorporated by reference for all purposes. The partially formed trench capacitor includes, for example a buried plate 165 surrounding the lower portion 255 of the trench. A node dielectric 164 is provided in the lower portion of the trench, separating the buried plate and the doped poly 161 in the trench. A dielectric collar 168 lines the sidewalls in the upper portion 256 of the trench to isolate the poly from the substrate. An etch stop layer 305, which facilitates processing of the IC, is provided on the surface of the substrate. The etch stop layer comprises, in one embodiment, silicon nitride. Other types of etch stop layers are also useful. A pad oxide layer (not shown) can be used to between the substrate and etch stop layer to reduce stress and promote adhesion.

Figure 4:
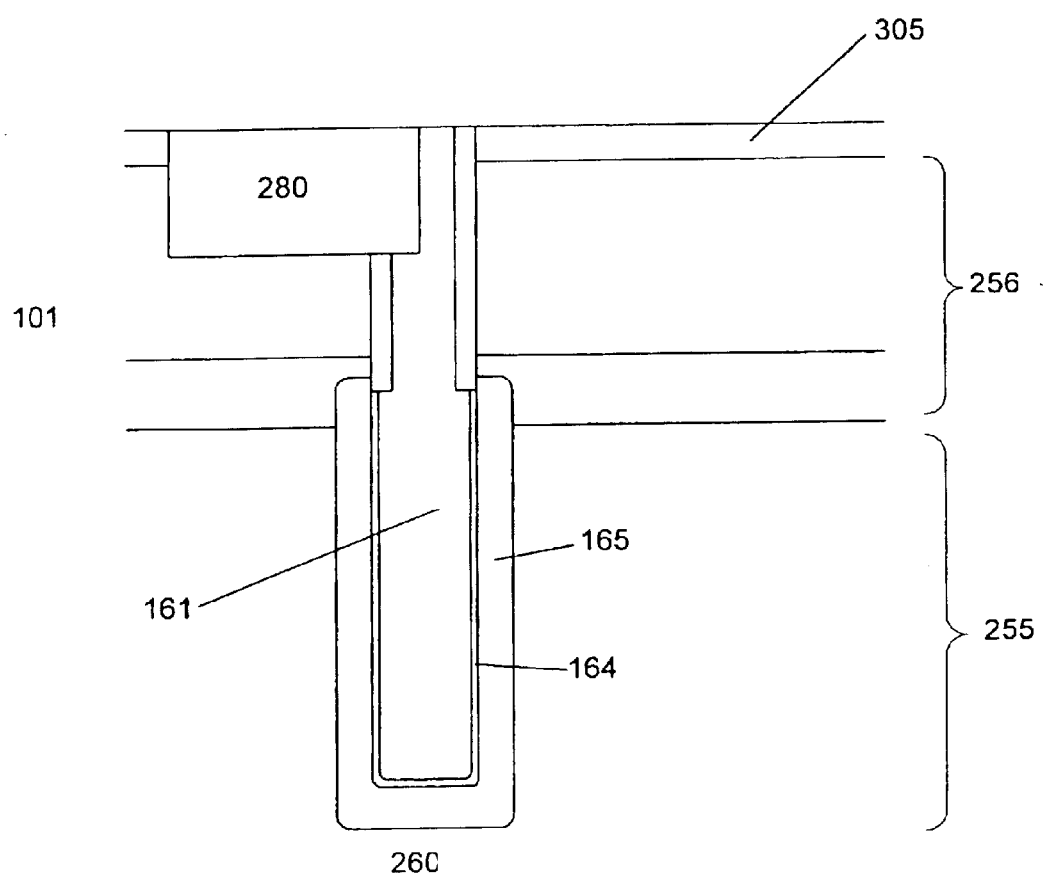

In accordance with one embodiment of the invention, the shallow trench isolation is formed prior to the formation of a buried strap. This advantageously allows thermal processing without impacting the buried strap diffusion. Referring to FIG. 4, a shallow trench 280 is etched in the substrate, overlapping a portion the trench capacitor. The depth of the trench is typically about 200–800 nm deep. A dielectric material is deposited by, for example, chemical vapor deposition on the surface of the substrate to fill the trench. The dielectric material comprises, in one embodiment, silicon oxide. Other dielectric materials are also useful. A nitride liner can be deposited prior to depositing the silicon oxide. Excess dielectric material are removed by, for example, chemical mechanical polishing (CMP). The CMP leaves a planar surface between the oxide and etch stop layer. A short oxide etch using HF can be used to remove residual oxide from the surface of the nitrade.

Figure 5:
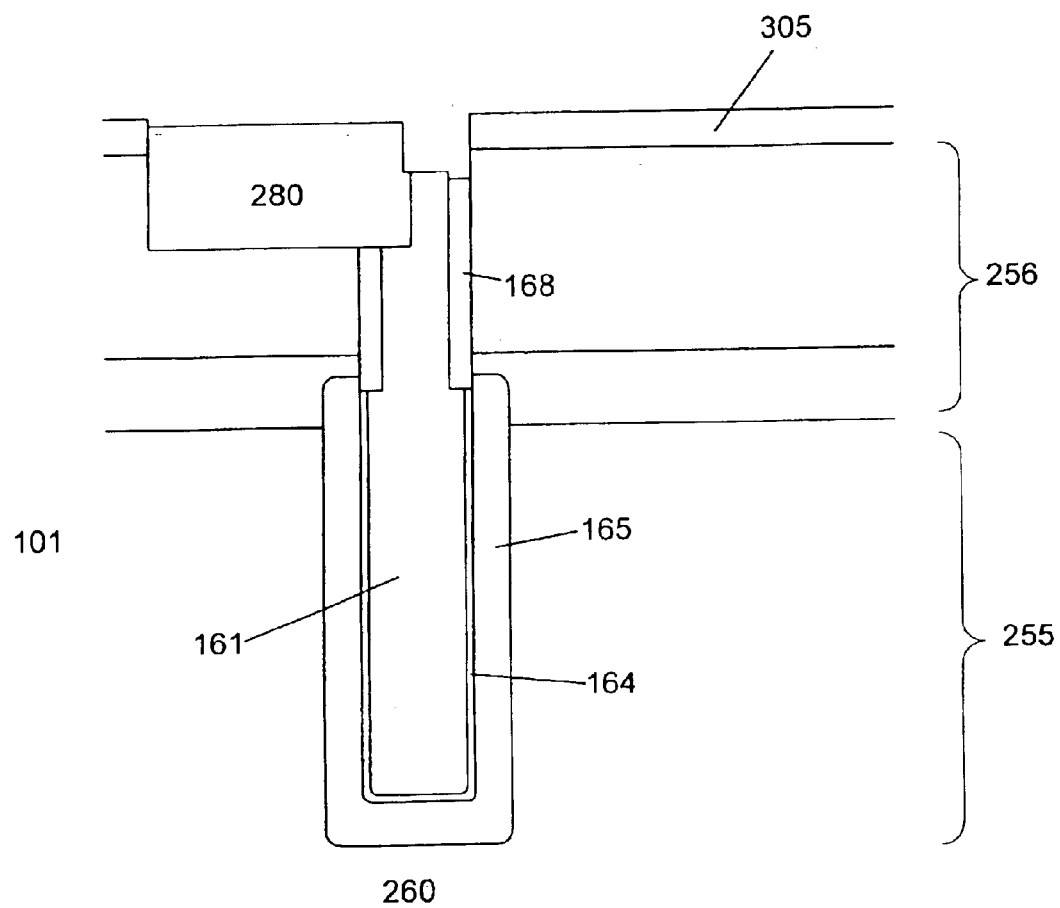
Figure 6:
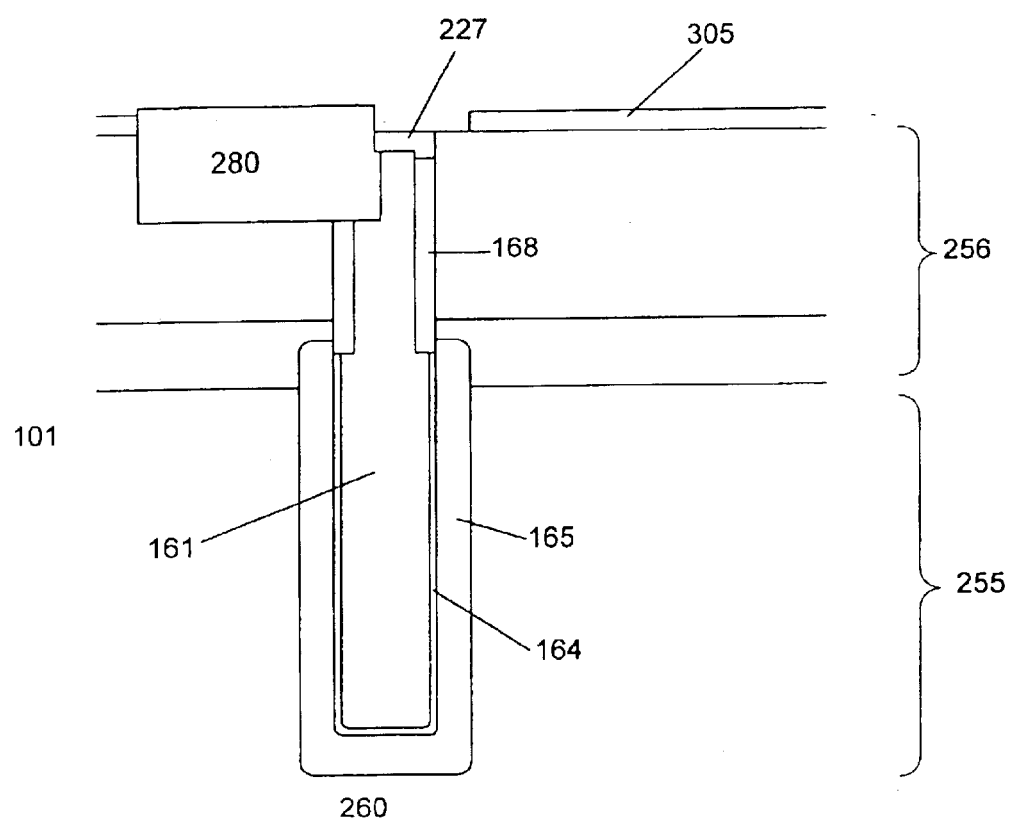

FIGS. 5-6 shows the process of forming a buried strap. Referring to FIG. 5, the poly 161 in the trench is recessed below the surface of the substrate to about the bottom of the buried strap using, for example, an etch (wet or dry) which is selective to oxide and nitride. Other types of etches can also be used. Typically, the poly is recessed to about 10–200 nm below the surface of the substrate. A wet etch, removes the exposed portion of the dielectric collar. The collar can be overetched, recessing the collar slightly below the upper surface of the poly.

Referring to FIG. 6, a poly layer is deposited on the substrate to fill the trench. In one embodiment, the poly comprises undoped or intrinsic poly. Excess poly is removed by CMP, producing a planar surface with the etch stop layer. The intrinsic poly is then recessed to form the buried strap 227. Typically, the poly is recessed to about the below the surface of the substrate.

Figure 7:
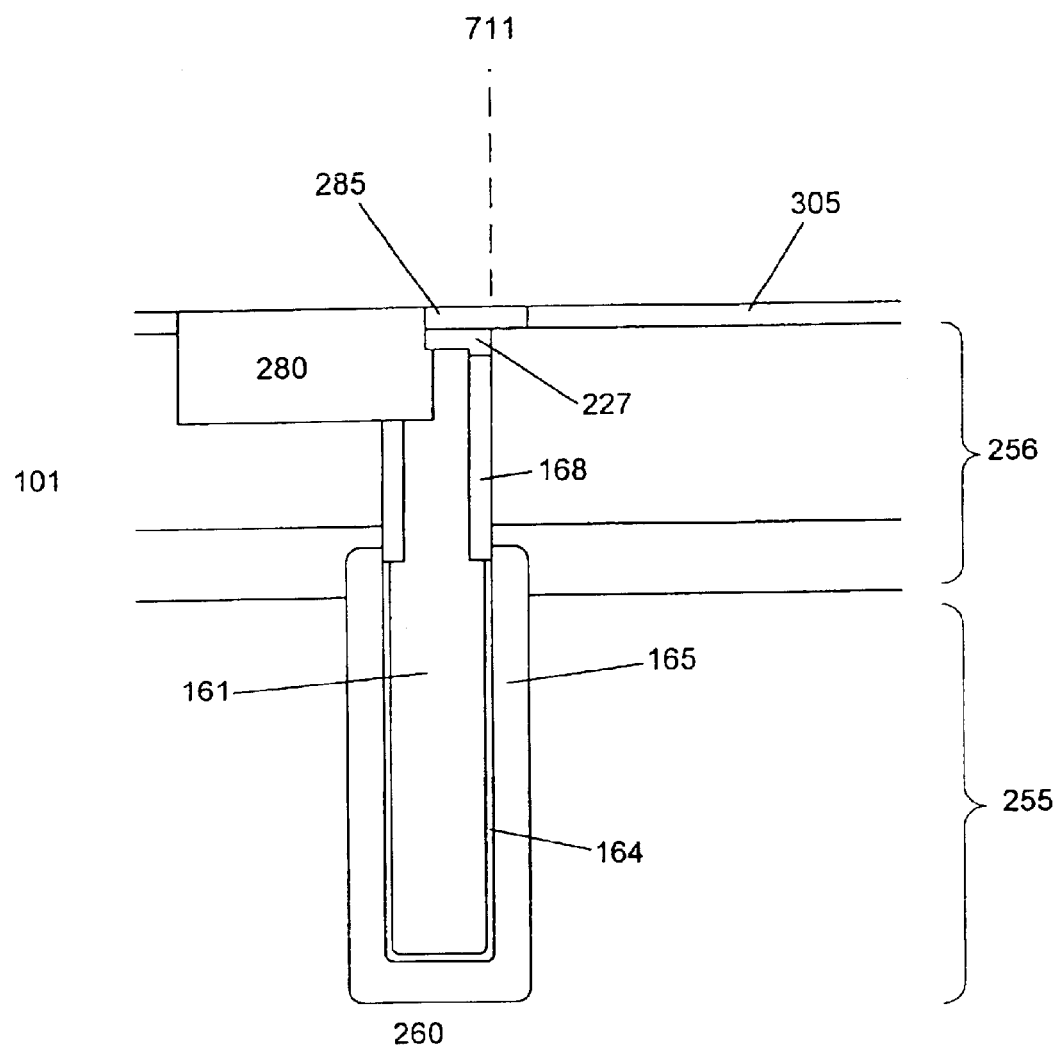

Referring to FIG. 7, the etch stop layer 305 is pulled back from an edge 711 of the trench using, for example, a wet etch selective to silicon. Since the wet etch is isotropic, the height of the etch stop layer is also reduced. The distance which the etch stop layer is pulled back is equal to the distance between the capacitor and the buried portion of the transistor. In one embodiment, the distance that the etch stop layer is pulled back is less that F. Typically, the distance is equal to about 20–100 nm.

A cap layer 285 comprising, for example, a dielectric material is deposited on he surface of the substrate. The cap layer fills the region above the trench capacitor. In one embodiment, the capping layer comprises oxide. Other dielectric materials are also useful. The cap layer serves as a self-aligned etch mask to form the STT. Optionally, a thin nitride layer can be deposited prior to depositing the cap layer. The nitride liner provides additional isolation. Excess dielectric material is removed by, for example, CMP, which results in a planar surface.

Figure 8:
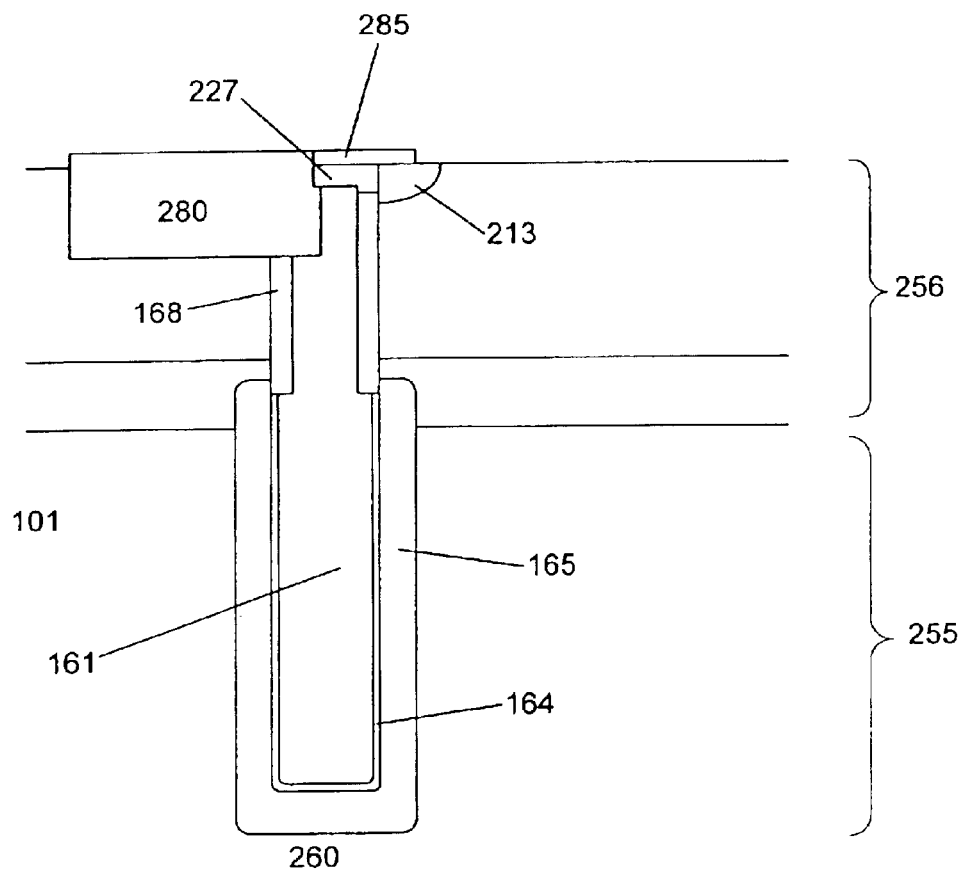

Referring to FIG. 8, an etch removes the nitride etch stop layer from the surface of the substrate. The etch for example is a wet etch selective to oxide. The oxide is then polished by, for example, CMP. The substrate serves as an etch stop, creating a planar surface between the oxide and substrate.

In one embodiment, a doped-well for the transistor is formed. The doped-well can be formed using conventional ion-implantation techniques. Such techniques include, for example, selectively implanting dopants into the substrate through a screen oxide layer 840 and mask (not shown). The screen oxide can be formed by thermal oxidation. The thermal oxidation also diffuses dopants from the storage node through the buried strap to form a diffusion region 213. P-type dopants are implanted to form a p-well for n-channel transistors. N-wells are formed for p-channel transistors. Alternatively, the doped-well or wells can be formed earlier in the process flow.

Figure 9:
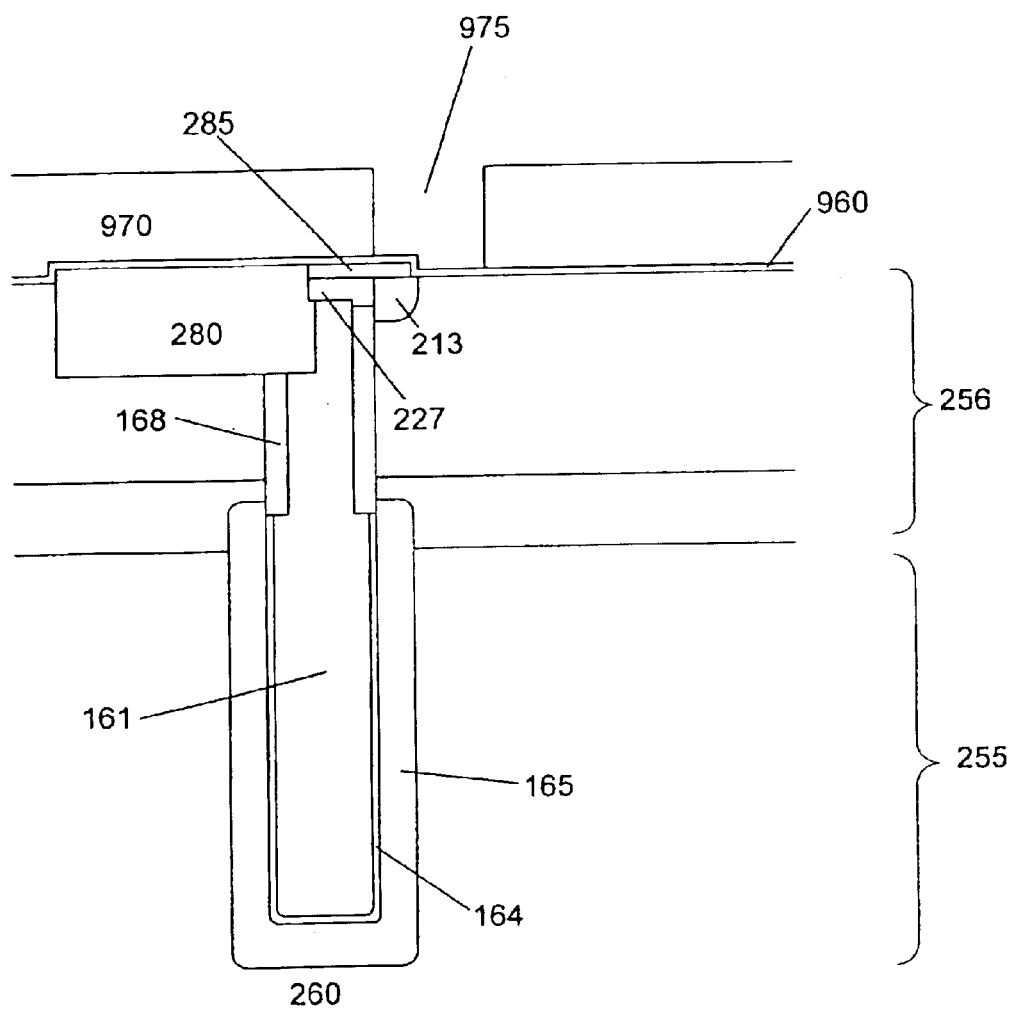

FIGS. 9-14 show the process for forming the transistor. In one embodiment, the gate conductor is formed using a damascene process. Referring to FIG. 9, an etch stop layer 960 is preferably formed over the substrate. If a screen oxide (not shown) is present, the etch stop layer can be formed over the screen oxide. The etch stop, for example, comprises silicon nitride. A mask layer 970 is formed over the etch stop layer. In one embodiment, the mask layer comprises silicon oxide. In one embodiment, the mask layer comprises a height substantially equal to the height of the gate stack. Typically, the height of the gate stack is about 250 nm. The mask layer is patterned to form openings 975 in which gate conductors are formed. Patterning of the mask layer is achieved using conventional photolithographic mask and etch techniques. The etch to form the openings, as shown, is selective to the etch stop layer.

Figure 10:
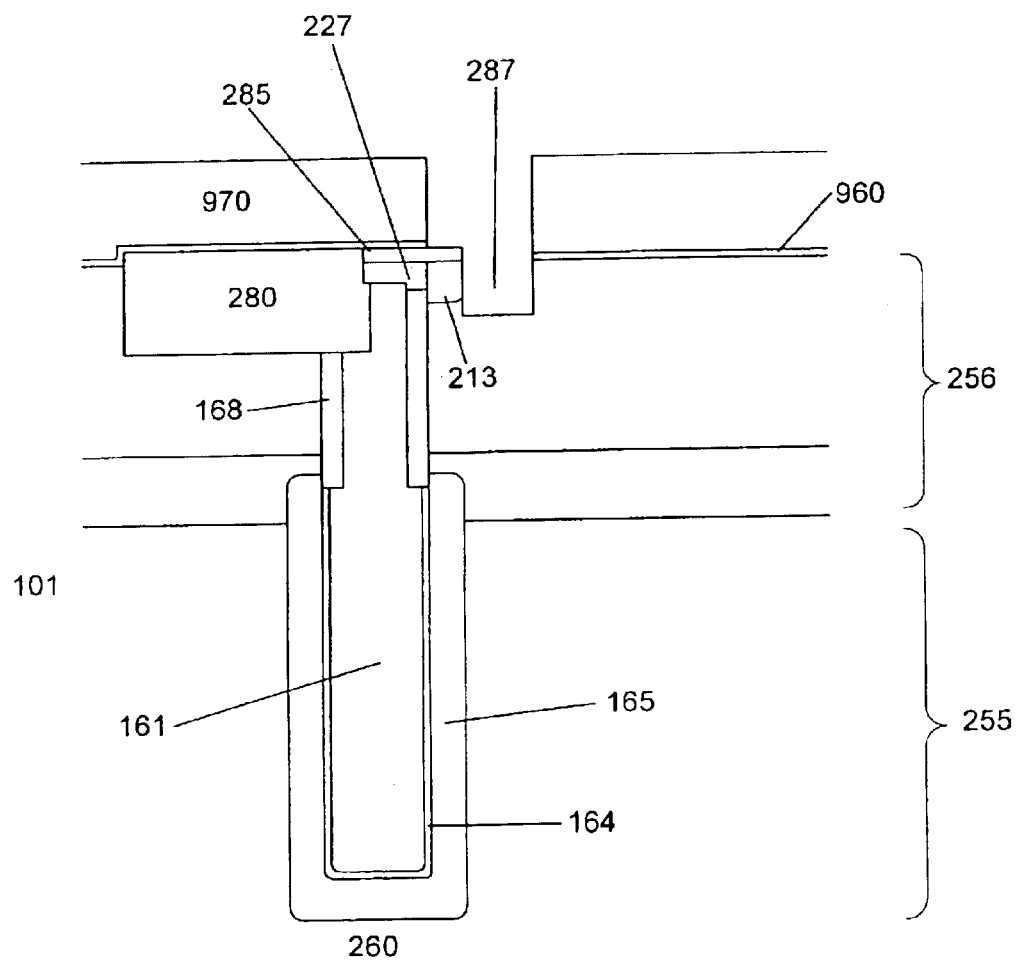

In FIG. 10, the exposed portion of the etch stop layer in opening 975 is removed by, for example, a reactive ion etch (RIE). The etch exposes the substrate surface and cap layer 285. An STT 287 is formed by etching the substrate selective to the mask layer and cap layer. In one embodiment, the etch comprises an RIE to form an STT having sidewalls and a bottom surface. The STT, in one embodiment, comprises a depth about 50–300 nm. The use of a wet etch can also be useful to form an STT with a different shape. Thus, the cap layer prevents the buried strap connection from getting cut off during the formation of the STT.

Figure 11:
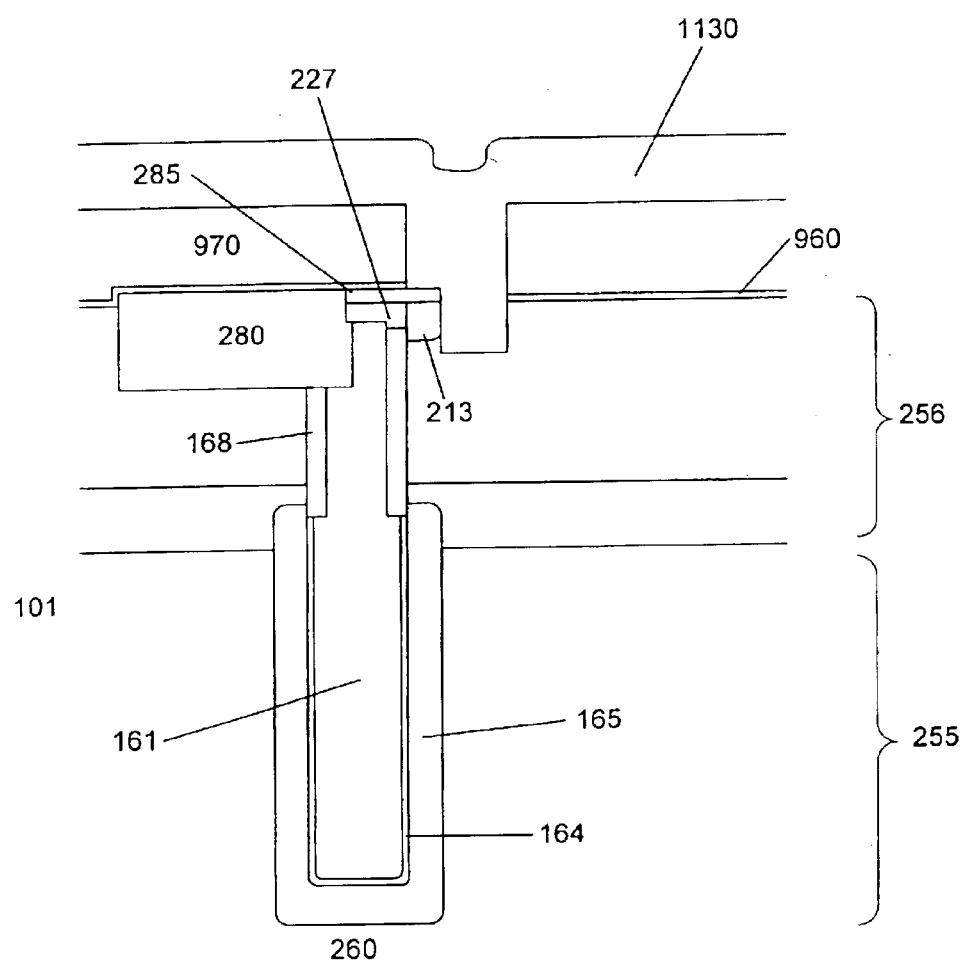

Referring to FIG. 11, a gate threshold voltage ($V_T$) adjust implant can be performed into the channel region, if necessary, to produce the desired gate threshold voltage. A gate oxide (not shown) is formed on the trench walls by thermal oxidation. A gate conductor layer 1130, such as poly is then deposited on the substrate, filling the opening 975 in the mask. In one embodiment, the gate conductor layer comprises doped- poly. Other types of gate conductor material can also be used. Performing the $V_T$ adjust implant after gate oxide formation is also useful.

Figure 12:
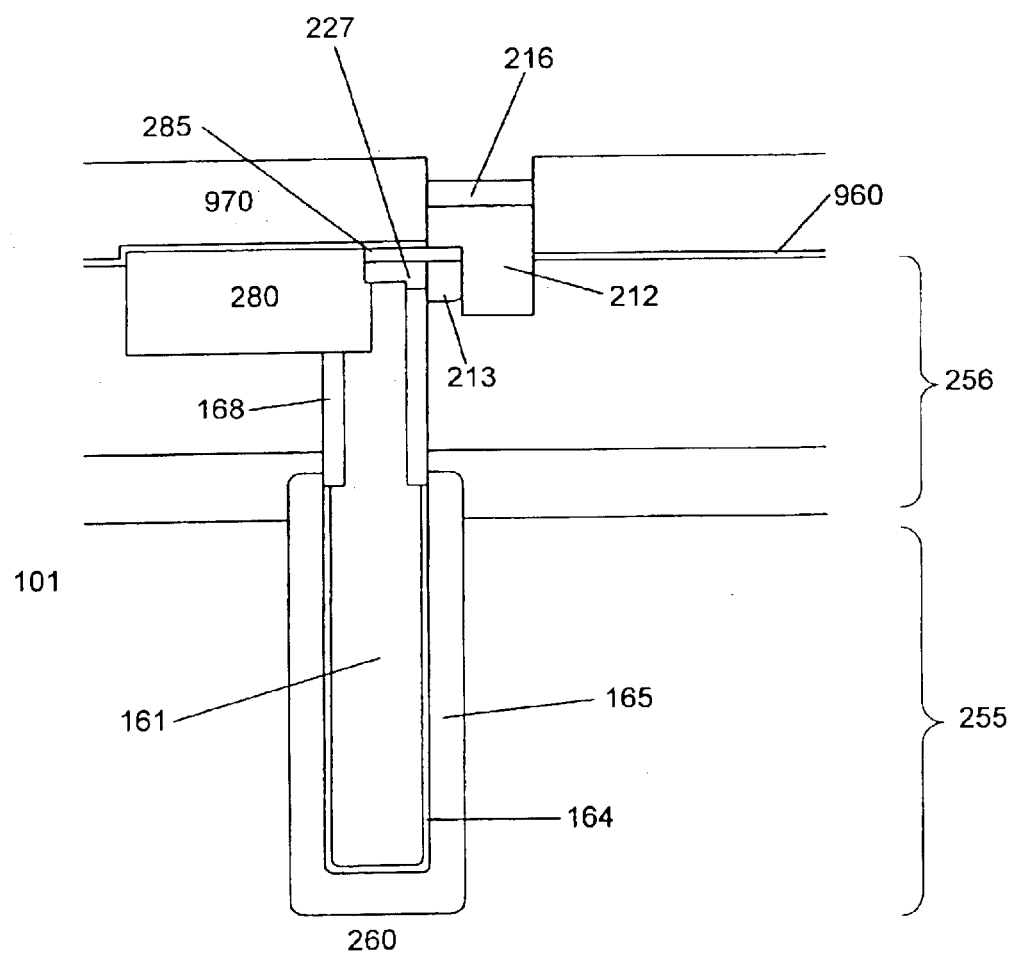

Referring to FIG. 12, excess poly above the mask can be removed by, for example, CMP. An etch is then performed to recess the poly to form a poly gate At conductor 211. The poly, for example, is recessed to a height of about 60 nm above the silicon surface. A salicide layer 216 can be formed over the poly in the opening.

Figure 13:
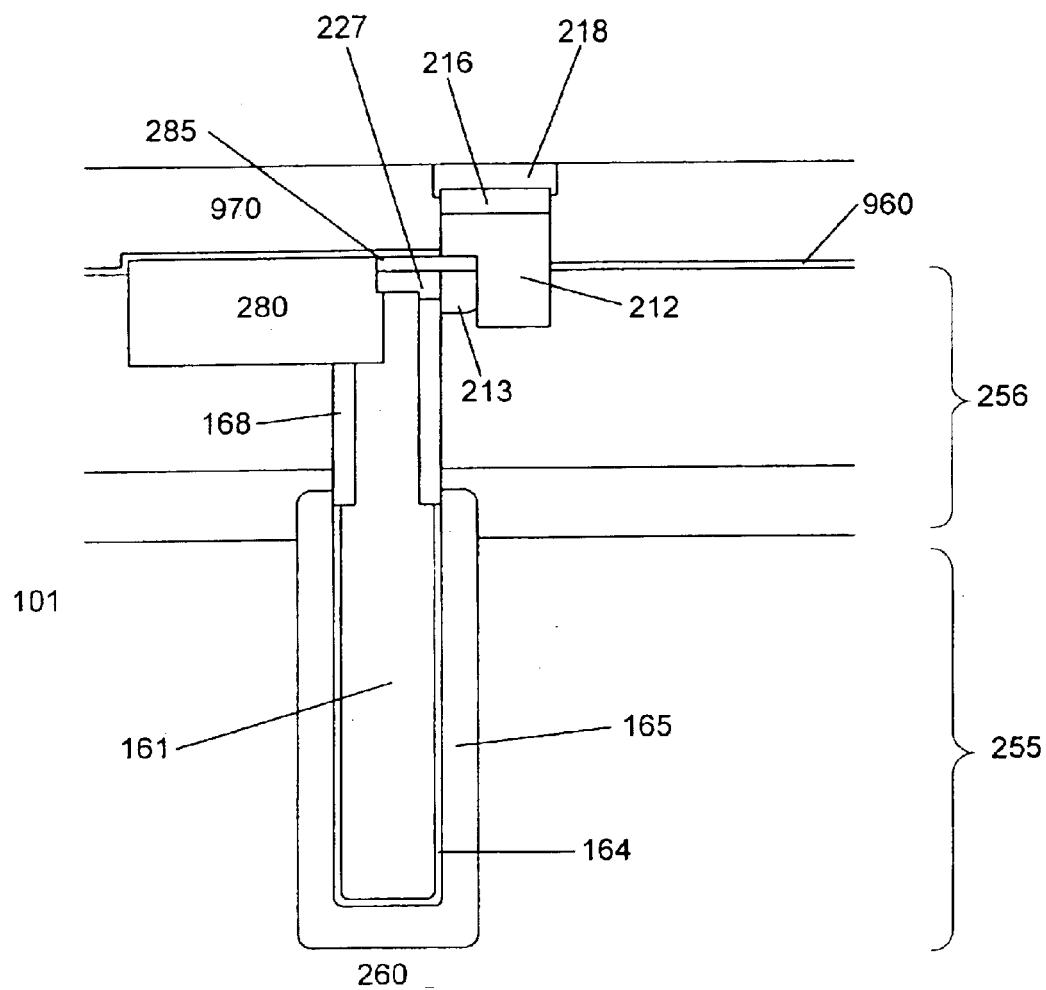

Referring to FIG. 13, a wet etch is performed to recess the oxide mask layer. The etch also pulls the oxide mask away from the gate stack. A dielectric layer 218 is deposited over the mask layer, filling the openings. In one embodiment, the dielectric layer comprises nitride. A CMP planarizes the nitride layer, forming a planar surface between the nitride and mask layer.

Figure 14:
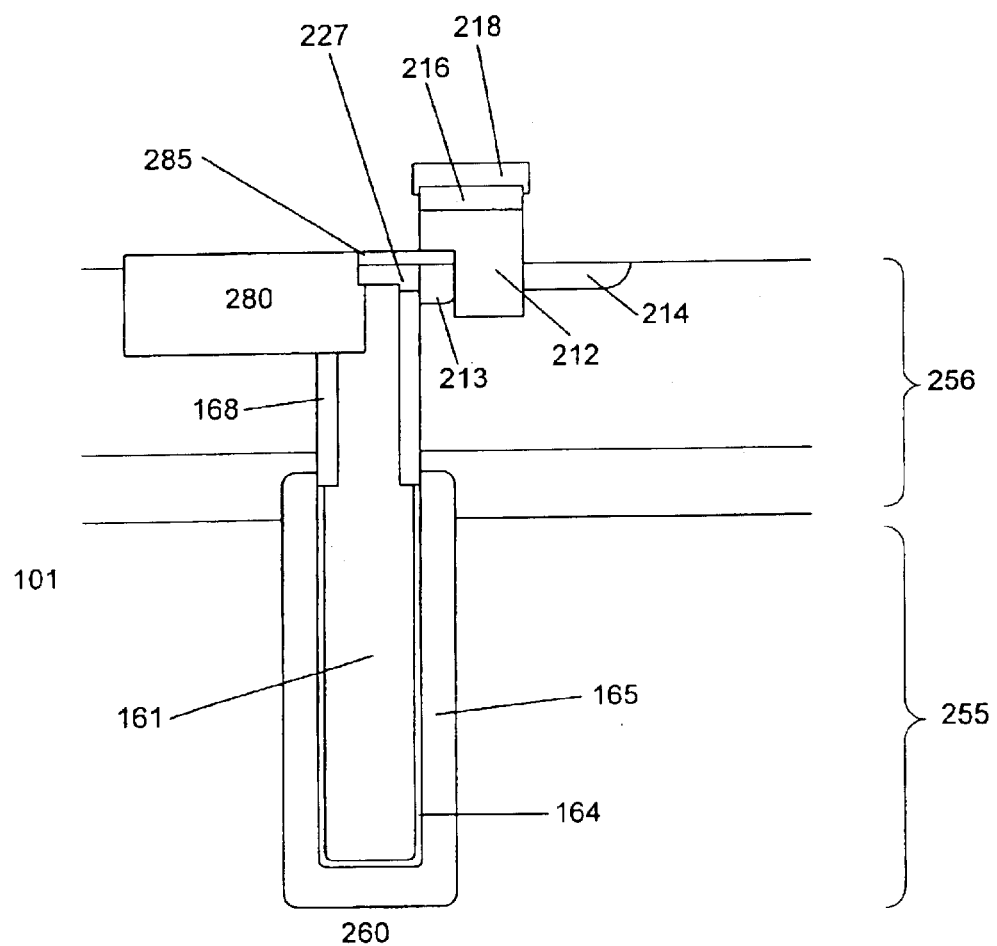

Referring to FIG. 14, the mask layer is removed by KIE. The mask layer which filled the pullback region protects part of the masking layer 970 during this etch, thus avoiding exposure of the gate sidewall and forms a gate sidewall spacer. Then, a second diffusion region 214 is formed by implanting dopants into the substrate adjacent to the gate. Other STIs and gate conductors (not shown) of the array can serve as a self-aligned mask for the ion implantation. The process continues to complete the formation of the memory cell and IC (e.g., interlevel dielectric, bitline contact and bitline).

Figure 15:
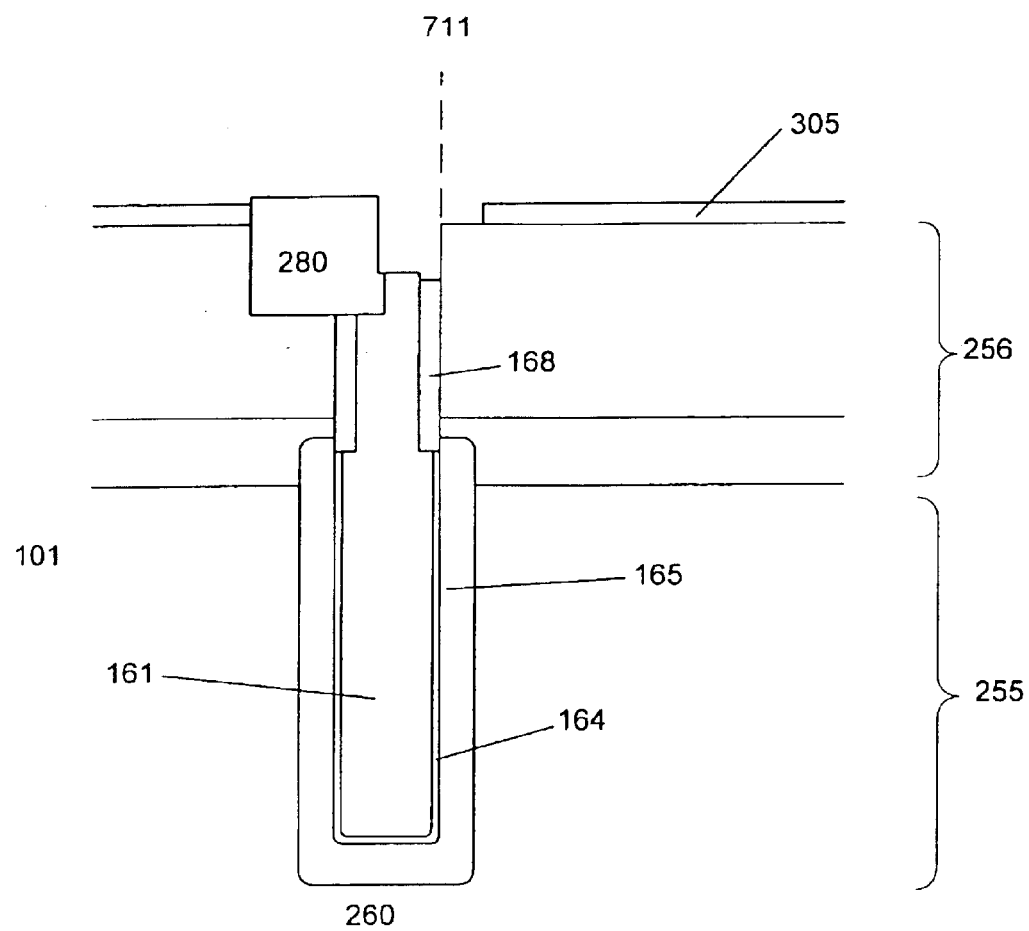
FIGS. 15-17 show a process of forming a memory cell in accordance with another embodiment of the invention.
Figure 16:
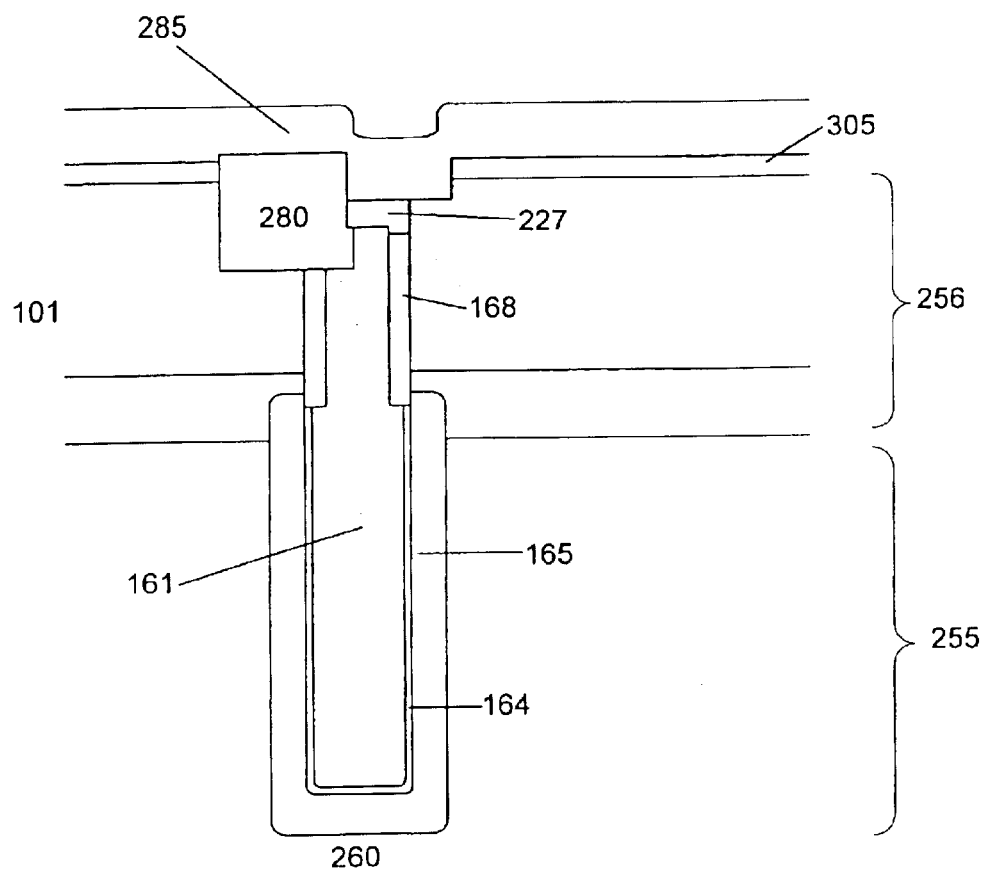
Figure 17:
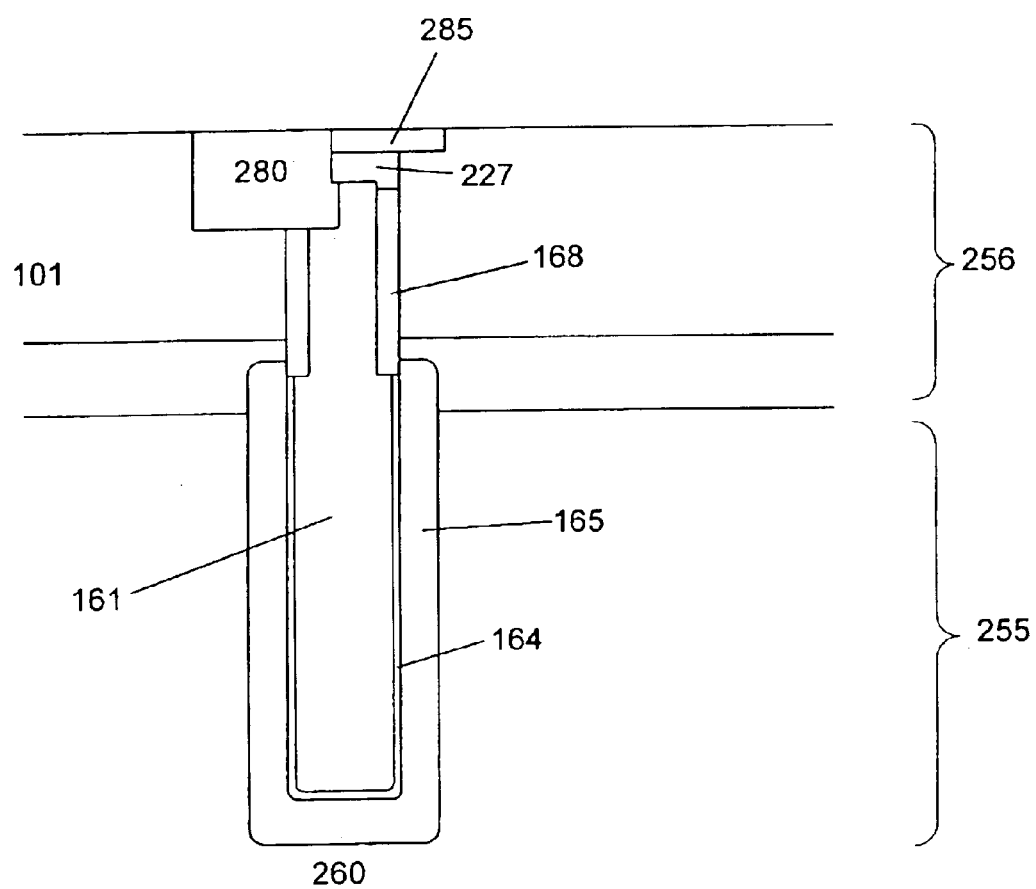

FIGS. 15-17 show a process for forming a memory cell in accordance with another embodiment of the invention. Referring to FIG. 15, a partially formed trench capacitor is shown after the formation of the STI 280 and recessing the poly 261 to the depth of the buried strap. In one embodiment, the etch stop layer 305 is pulled back from edge 711 of the trench sidewall to a distance D1 by an isotropic etch (wet or dry).

Referring to FIG. 16, a poly layer 227 is deposited on the substrate to fill the opening above the trench capacitor. The poly layer is recessed to form the buried strap. In one embodiment, recessing the poly layer also recesses the substrate exposed by the pulling back of the etch stop layer. A dielectric layer 285 is then deposited over the substrate to fill the opening above the trench. The dielectric layer, in one embodiment, comprises oxide.

Referring to FIG. 17, excess material from the dielectric layer is polished away to form a planar surface with the etch stop layer. The etch stop layer is then removed, exposing the substrate. A polish then removes the dielectric layer above the substrate, resulting in a planar surface with the substrate. The process continues as described from FIG. 8 and onwards.

While the invention has been particularly shown and described with reference to various embodiments, it will be recognized by those skilled in the art that modifications and changes may be made to the present invention without departing from the spirit and scope thereof. The scope of the invention should therefore be determined not with reference to the above description but with reference to the appended claims along with their full scope of equivalents.

What is claimed is:

1. A method of producing a memory cell, comprising:
   providing a trench capacitor in a substrate;
   providing a dielectric layer on an upper portion of the trench capacitor;
   providing a transistor coupled to said trench capacitor, including etching the substrate to produce a transistor trench adjacent the trench capacitor, and providing in the transistor trench a portion of a gate of the transistor; and
   said etching step including using the dielectric layer as an etch mask.

2. The method of claim 1, wherein a width of the transistor trench is less than a lithographic groundrule.

3. The method of claim 3, including providing a portion of the gate of the transistor outside of the transistor trench, said portion having a width greater than the width of the transistor trench.

4. The method of claim 3, including providing a portion of the gate of the transistor outside of the transistor trench, said portion having a width equal to the lithographic groundrule.

5. The method of claim 1, wherein the gate is doped polysilicon.

6. The method of claim 1, including providing a cap layer over a further portion of the gate that is outside of the transistor trench.

7. The method of claim 1, including providing a salicide layer over a further portion of the gate that is outside of the transistor trench.

8. The method of claim 7, including providing a cap layer over the further portion of the gate.

9. The method of claim 1, wherein the dielectric layer is silicon oxide.

10. The method of claim 9, wherein the gate is doped polysilicon.

11. The method of claim 1, including providing a portion of the gate of the transistor outside of the transistor trench, said portion having a width greater than the width of the transistor trench.

12. The method of claim 1, including providing a portion of the gate of the transistor outside of the transistor trench, said portion having a width equal to a lithographic groundrule.

13. An article of manufacture including an integrated circuit having a memory cell produced according to the method of claim 1.

* * * * *

UNITED STATES PATENT AND TRADEMARK OFFICE
CERTIFICATE OF CORRECTION

PATENT NO.     : 6,812,091 B1
DATED          : November 2, 2004
INVENTOR(S)    : Gruening et al.

It is certified that error appears in the above-identified patent and that said Letters Patent is hereby corrected as shown below:

Column 6,
Lines 36 and 40, delete "claim 3" and insert -- claim 2 --.

Signed and Sealed this

First Day of February, 2005

JON W. DUDAS
*Director of the United States Patent and Trademark Office*